US008994408B2

United States Patent
Hamada et al.

(10) Patent No.: US 8,994,408 B2
(45) Date of Patent: Mar. 31, 2015

(54) ELECTRONIC CIRCUIT

(71) Applicant: Fujitsu Limited, Kawasaki-shi, Kanagawa (JP)

(72) Inventors: Takayuki Hamada, Kawasaki (JP); Sanroku Tsukamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/191,135

(22) Filed: Feb. 26, 2014

(65) Prior Publication Data
US 2014/0320171 A1 Oct. 30, 2014

(30) Foreign Application Priority Data
Apr. 30, 2013 (JP) ................................ 2013-095999

(51) Int. Cl.
*H03K 5/22* (2006.01)
*G01R 19/00* (2006.01)

(52) U.S. Cl.
CPC ........ *G01R 19/0038* (2013.01); *G01R 19/0092* (2013.01)
USPC ............................................. 327/70; 327/63

(58) Field of Classification Search
USPC ..................................................... 327/63, 70
See application file for complete search history.

(56) References Cited

U.S. PATENT DOCUMENTS

| | | | | | |
|---|---|---|---|---|---|
| 5,727,027 | A | * | 3/1998 | Tsuda | 375/329 |
| RE39,283 | E | * | 9/2006 | Schollhorn | 708/313 |
| 8,867,595 | B1 | * | 10/2014 | Luo et al. | 375/224 |
| 2007/0081578 | A1 | * | 4/2007 | Fudge et al. | 375/130 |
| 2008/0218890 | A1 | * | 9/2008 | Esumi et al. | 360/53 |
| 2013/0278294 | A1 | * | 10/2013 | Shibasaki, Takayuki | 327/97 |
| 2014/0040653 | A1 | * | 2/2014 | Etkin et al. | 713/500 |
| 2014/0286378 | A1 | * | 9/2014 | Doi | 375/219 |

FOREIGN PATENT DOCUMENTS

| | | |
|---|---|---|
| JP | 2003-158456 A | 5/2003 |
| JP | 2011-29983 A | 2/2011 |
| JP | 2012-147079 A | 8/2012 |

* cited by examiner

*Primary Examiner* — Adam Houston
(74) *Attorney, Agent, or Firm* — Arent Fox LLP

(57) ABSTRACT

An electronic circuit includes: a weighting circuit configured to generate a first current by weighting and combining a first input signal and a second input signal in accordance with a modifiable coefficient and to generate a second current by weighting and combining a first inverted signal and a second inverted signal in accordance with the coefficient, the first inverted signal being an inverted signal of the first input signal, the second inverted signal being an inverted signal of the second input signal; and a decision circuit configured to decide on an output signal by comparing the first current with the second current.

9 Claims, 16 Drawing Sheets

ELECTRONIC CIRCUIT

CROSS-REFERENCE TO RELATED APPLICATION

This application is based upon and claims the benefit of priority of the prior Japanese Patent Application No. 2013-095999, filed on Apr. 30, 2013, the entire contents of which are incorporated herein by reference.

FIELD

The embodiments discussed herein are related to electronic circuits and, for example, to an electronic circuit that includes a decision circuit.

BACKGROUND

A/D conversion circuits that convert analog signals to digital signals are known. An A/D conversion circuit in which a ratio between tail currents at a differential pair to which a differential input signal is inputted is made to differ is known (e.g., Japanese Laid-open Patent Publication No. 2003-158456 and Japanese Laid-open Patent Publication No. 2011-29983). An asynchronous reception circuit in which interpolation data is generated by interpolating sampled input data is known (e.g., Japanese Laid-open Patent Publication No. 2012-147079).

For example, when the interpolation data is generated from the sampled input data, the input data is weighted and combined, and thus the interpolation data is generated. A decision is made so as to digitize the interpolation data. The size of a circuit for carrying out the weighting and making the decision increases.

SUMMARY

According to an aspect of the invention, an electronic circuit includes: a weighting circuit configured to generate a first current by weighting and combining a first input signal and a second input signal in accordance with a modifiable coefficient and to generate a second current by weighting and combining a first inverted signal and a second inverted signal in accordance with the coefficient, the first inverted signal being an inverted signal of the first input signal, the second inverted signal being an inverted signal of the second input signal; and a decision circuit configured to decide on an output signal by comparing the first current with the second current.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
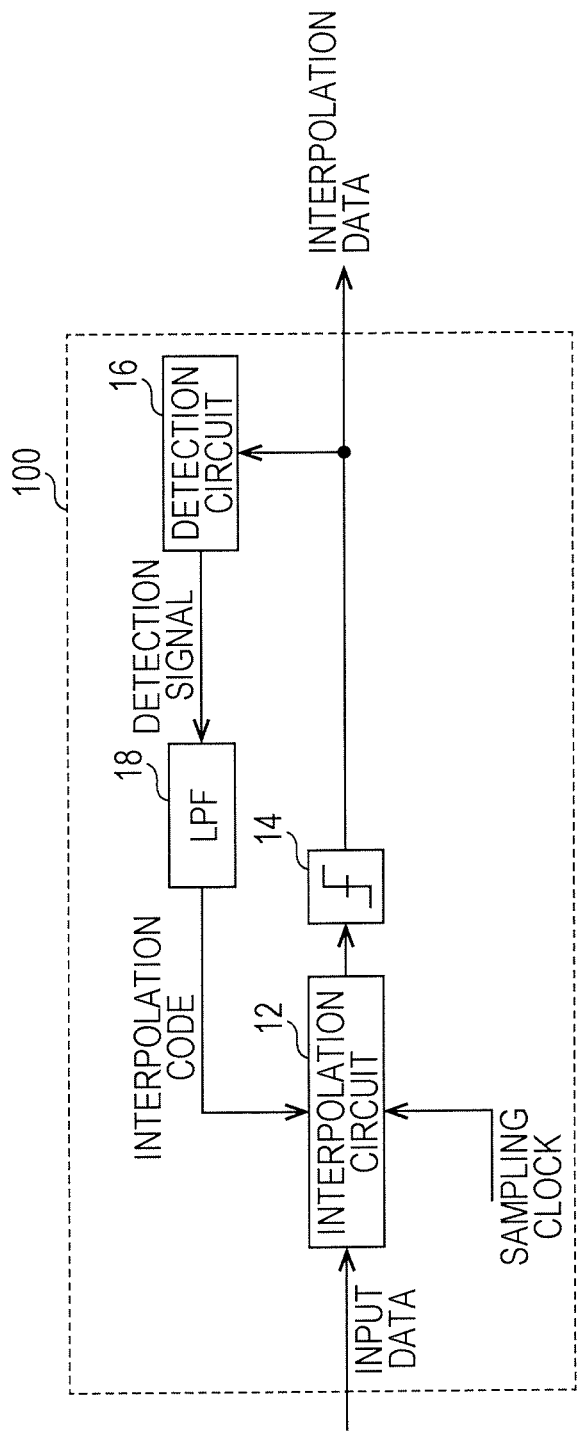
FIG. 1 is a block diagram illustrating a reception circuit.

First, an asynchronous reception circuit that includes an interpolation circuit in which an electronic circuit according to an embodiment is used will be described. FIG. 1 is a block diagram illustrating a reception circuit that includes an interpolation circuit. With reference to FIG. 1, a reception circuit 100 includes an interpolation circuit 12, a decision circuit 14, a detection circuit 16, and a low pass filter (LPF) 18. The interpolation circuit 12 includes a data point and a boundary point and generates interpolation data from input data inputted in time series in accordance with an interpolation code. The decision circuit 14 decides between a high level and a low level by comparing the interpolation data with a reference value. Through this, the decision circuit 14 generates output data. The detection circuit 16 detects the phase of the output data on the basis of a boundary point of the output data and outputs a detection signal. The LPF 18 filters the detection signal to thus generate the interpolation code. A clock data recovery (CDR) circuit, for example, can be used as the reception circuit 100.

Figure 2:
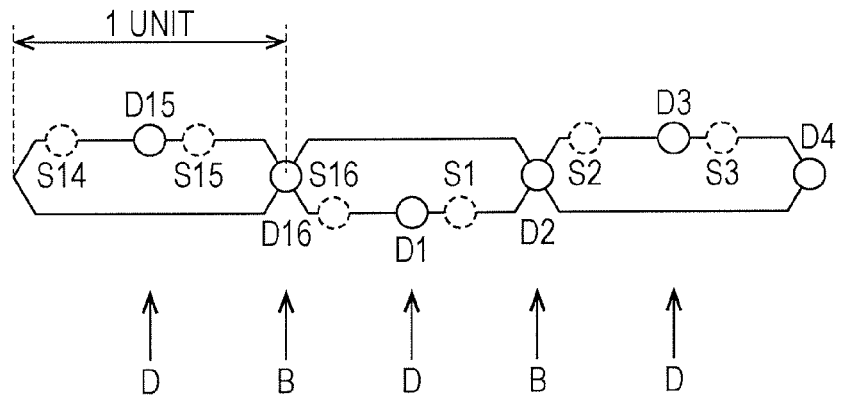
FIG. 2 is a diagram illustrating a signal relative to time.

FIG. 2 is a diagram illustrating a signal relative to time. Although an interpolation circuit that employs a 2× system in which two pieces of data are sampled per unit interval is described as an example hereinafter, another system may instead be employed. With reference to FIG. 2, Sn corresponds to input data inputted in time series. The interpolation circuit 12 generates a single piece of interpolation data Dn from two pieces of input data $S(n-1)$ and Sn (n is a natural number). When an interpolation code k satisfies $0 \leq k \leq 1$, the interpolation data Dn can be generated through $Dn=(1-k) \times S(n-1)+k \times Sn$. Through this, interpolation data that is in phase with the input data can be generated. In this manner, the interpolation code k is a coefficient for weighting input data. In the 2× system, a data point D and a boundary point B are generated in an alternating manner. A data point is handled as digital data in a circuit downstream from the reception circuit, and a boundary point is a point to which data shifts. In the 2× system, a data point is, for example, an intermediate point between boundary points.

Figure 3:
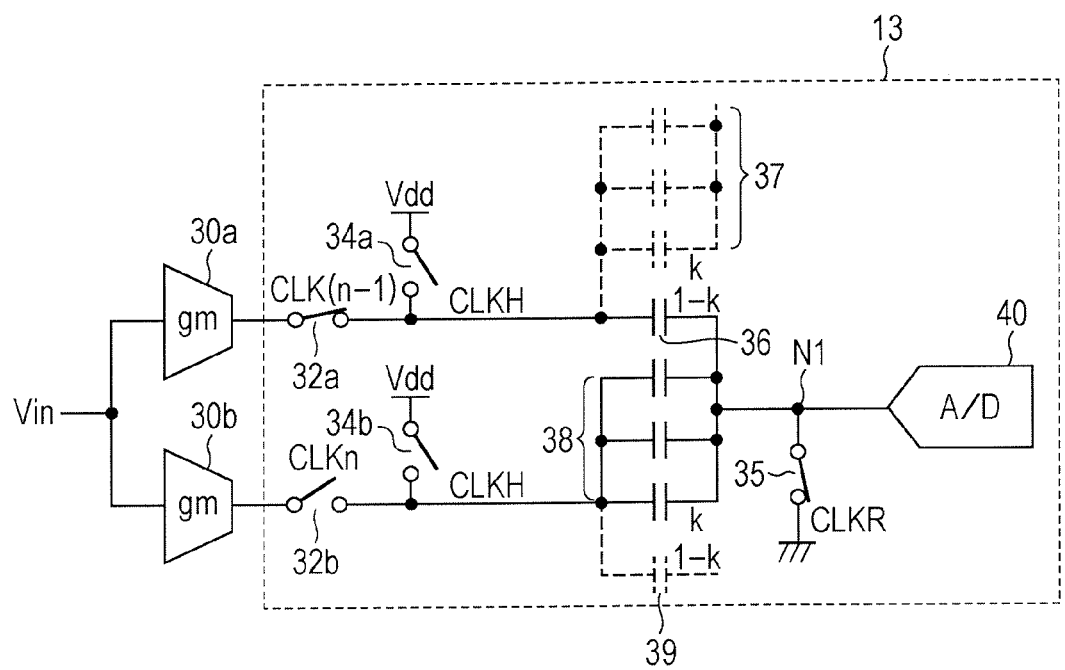
FIG. 3 is a circuit diagram illustrating part of an interpolation circuit according to a comparative example.

A comparative example of an interpolation circuit in an asynchronous reception circuit will now be described. In the comparative example, an electronic circuit according to an embodiment is not used. FIG. 3 is a circuit diagram illustrating part of the interpolation circuit according to the comparative example and illustrates a circuit that generates a single piece of interpolation data from two temporally adjacent pieces of input data. With reference to FIG. 3, the interpolation circuit 12 partially includes gm circuits 30a and 30b and a sampling circuit 13. The sampling circuit 13 includes switches 32a, 32b, 34a, 34b, and 35, variable capacitors 36 and 38, and an analog/digital converter (A/D) 40. The path branches into two between an input Vin and a node N1. The gm circuit 30a, the switch 32a, and the variable capacitor 36 are electrically connected in series in one of the branched paths. The gm circuit 30a serves as a voltage current conversion circuit that converts an input signal Vin into a current. The switch 32a is electrically connected between an output terminal of the gm circuit 30a and one end of the variable capacitor 36. The switch 34a is electrically connected between the one end of the variable capacitor 36 and a power supply Vdd. The other end of the variable capacitor 36 is connected to the node N1.

The gm circuit 30b, the switch 32b, and the variable capacitor 38 are electrically connected in series in the other one of the branched paths. The gm circuit 30b serves as a voltage current conversion circuit that converts an input signal Vin into a current. The switch 32b is electrically connected between an output terminal of the gm circuit 30b and one end of the variable capacitor 38. The switch 34b is electrically connected between the one end of the variable capacitor 38 and a power supply Vdd. The other end of the variable capacitor 38 is connected to the node N1. The switch 35 is electrically connected between the node N1 and a ground. The node N1 is connected to the A/D 40. The switches 32a, 32b, 34a, 34b, and 35 are turned on when clocks CLK(n−1), CLKn, CLKH, CLKH, and CLKR are high, respectively, and are turned off when the clocks CLK(n−1), CLKn, CLKH, CLKH, and CLKR are low, respectively. The variable capacitor 36 takes a capacitance value that corresponds to 1−k, and a capacitor 37, which corresponds to k, does not contribute to the capacitance value. The variable capacitor 38 takes a capacitance value that corresponds to k, and a capacitor 39, which corresponds to 1−k, does not contribute to the capacitance value.

Figure 4:
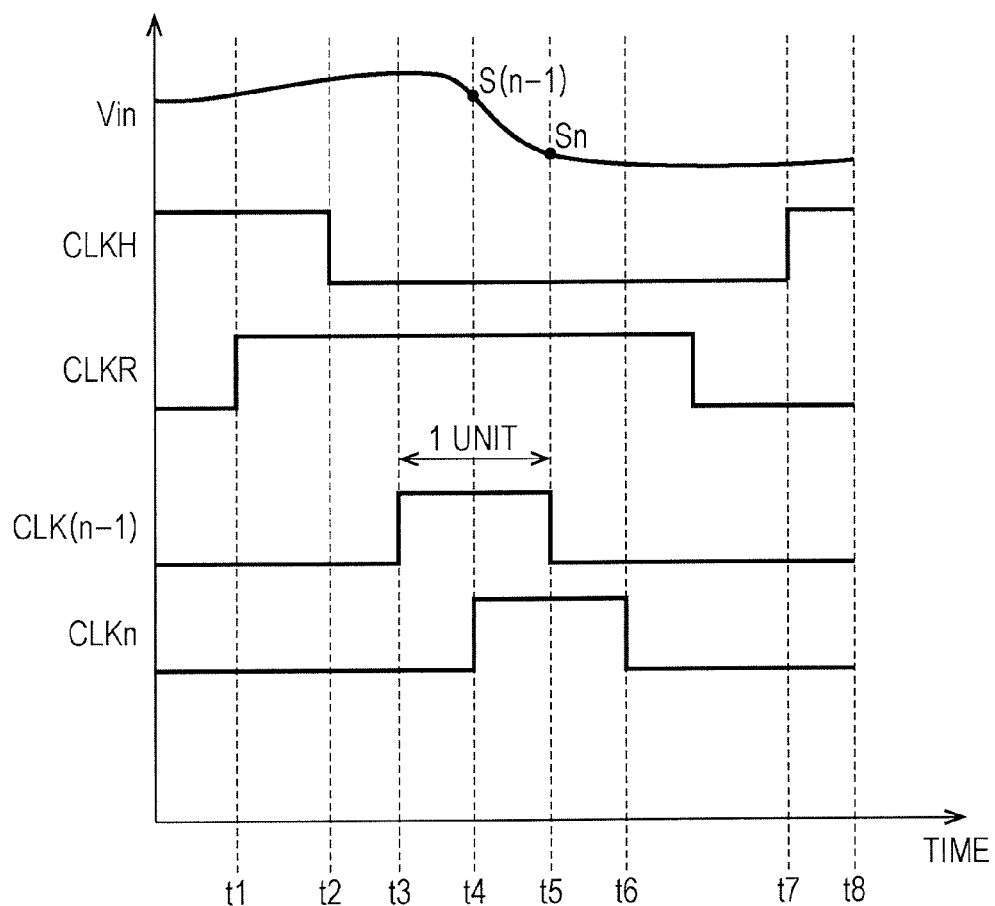
FIG. 4 is a timing chart illustrating an operation of each switch according to a comparative example.
Figure 5:
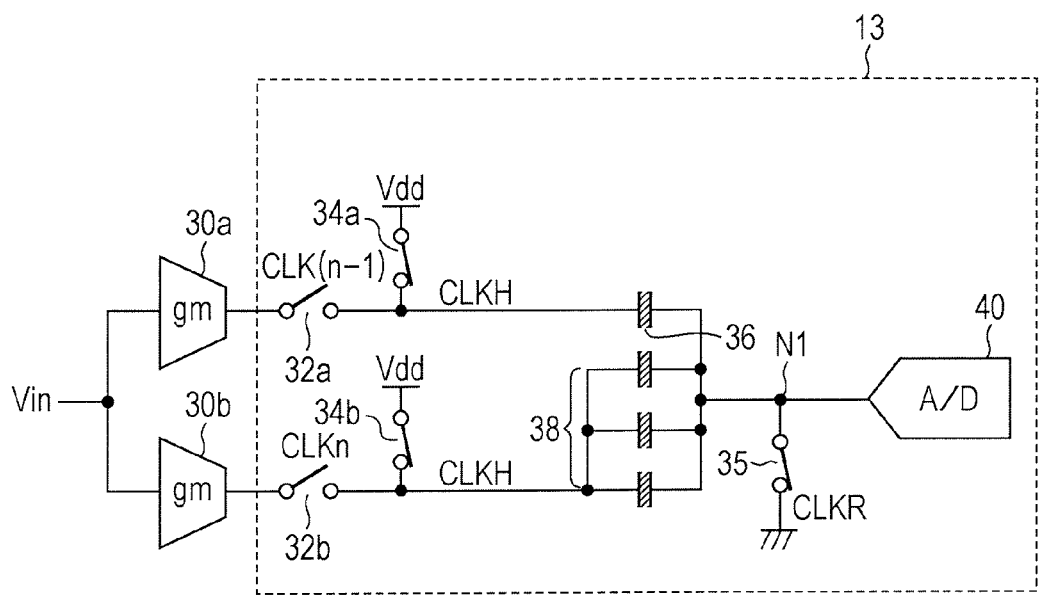
FIG. 5 is a circuit diagram illustrating an operation of part of an interpolation circuit according to a comparative example (part 1)

FIG. 4 is a timing chart illustrating an operation of each of the switches according to the comparative example. FIGS. 5 to 8 are circuit diagrams each illustrating an operation of part of the interpolation circuit according to the comparative example. Hatching in the capacitors 36 and 38 illustrated in FIGS. 5 to 8 indicates electric charge amounts accumulated in the capacitors 36 and 38. The area of the hatching corresponds to an accumulated electric charge amount. With reference to FIGS. 4 and 5, CLKH, CLKR, CLK(n−1), and CLKn are, respectively, high, high, low, and low during a period from a time t1 to a time t2. During this period, the variable capacitor 36 is electrically connected in series between the power supply Vdd and the ground, and the variable capacitor 38 is electrically connected in series between the power supply Vdd and the ground. Through this, the variable capacitors 36 and 38 are charged.

Figure 6:
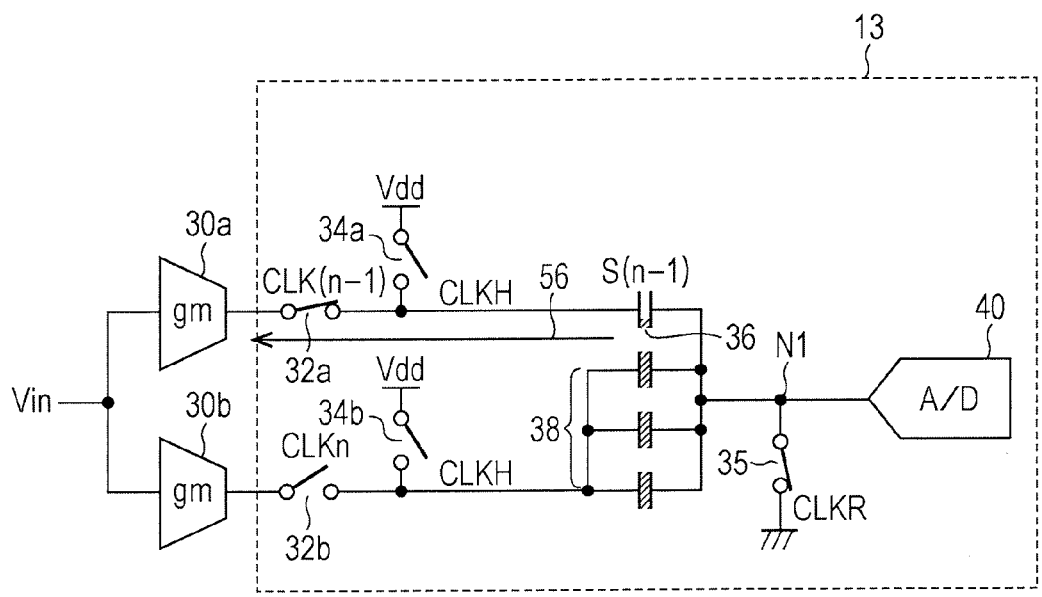
FIG. 6 is a circuit diagram illustrating an operation of part of an interpolation circuit according to a comparative example (part 2)

With reference to FIGS. 4 and 6, CLKH, CLKR, and CLK(n−1) are, respectively, low, high, and high during a period from a time t3 to a time t5. During this period, the variable capacitor 36 is electrically connected in series between the gm circuit 30a and the ground. Through this, an electric charge is discharged from the variable capacitor 36 as indicated by an arrow 56. Thus, an electric charge in an amount corresponding to a voltage input signal Vin (corresponding to input data S(n−1)) during the period from the time t3 to the time t5 is accumulated in the variable capacitor 36.

Figure 7:
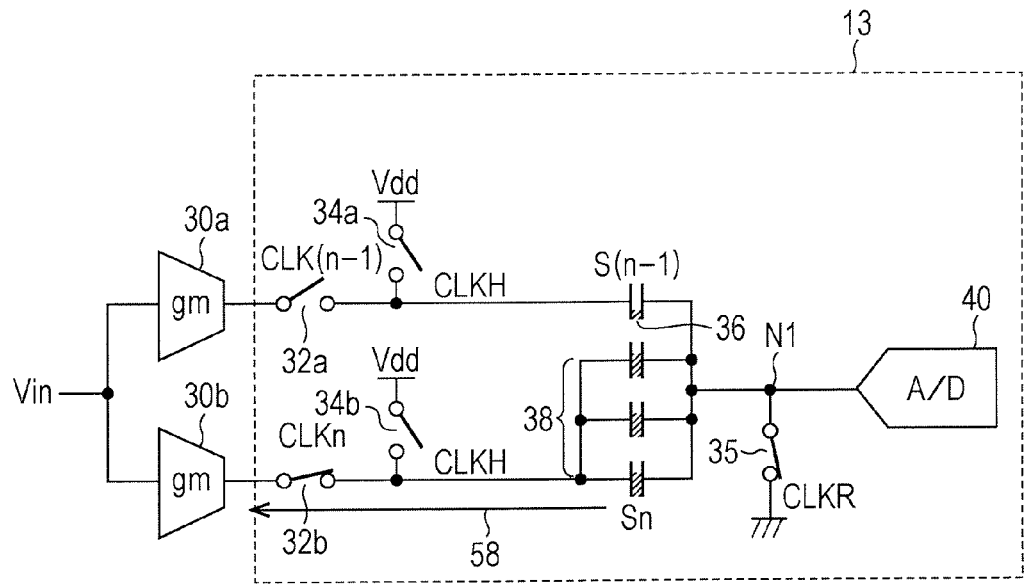
FIG. 7 is a circuit diagram illustrating an operation of part of an interpolation circuit according to a comparative example (part 3)

With reference to FIGS. 4 and 7, CLKH, CLKR, and CLKn are, respectively, low, high, and high during a period from a time t4 to a time t6. During this period, the variable capacitor 38 is electrically connected in series between the gm circuit 30b and the ground. Through this, an electric charge is discharged from the variable capacitor 38 as indicated by an arrow 58. Thus, an electric charge in an amount corresponding to a voltage input signal Vin (corresponding to input data Sn) during the period from the time t4 to the time t6 is accumulated in the variable capacitor 38.

Figure 8:
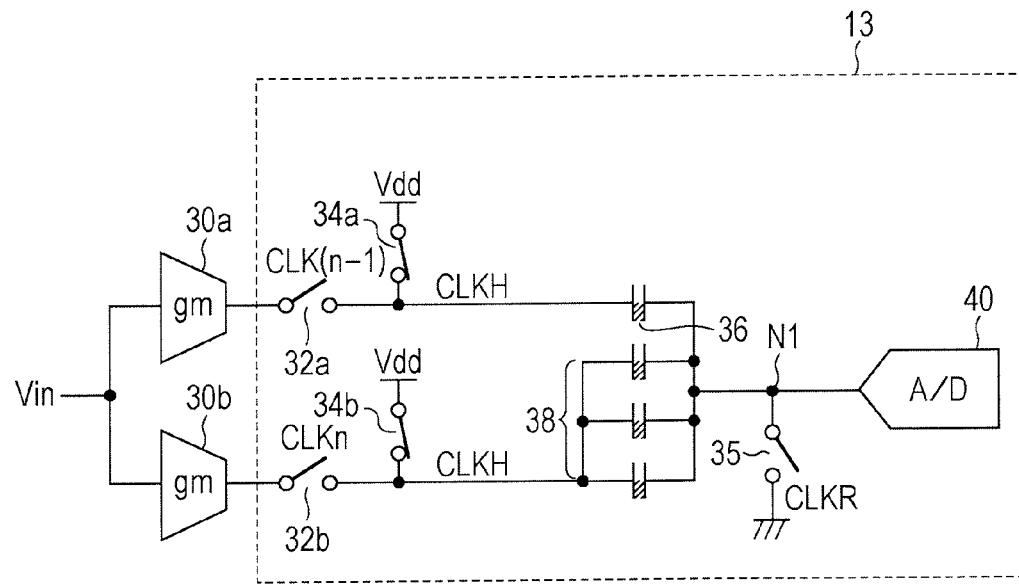
FIG. 8 is a circuit diagram illustrating an operation of part of an interpolation circuit according to a comparative example (part 4)

With reference to FIGS. 4 and 8, CLKH, CLKR, CLK(n−1), and CLKn are, respectively, high, low, low, and low during a period from a time t7 to a time t8. During this period, the variable capacitors 36 and 38 are electrically connected in parallel between the power supplies Vdd and the node N1. The node N1 is cut off from the ground. Through this, electric charges accumulated in the variable capacitors 36 and 38 are combined. Thus, a voltage at the node N1 takes a value that corresponds to the interpolation data Dn. The A/D 40 converts the voltage at the node N1 into a digital value and outputs the result.

In a manner as described above, the interpolation data Dn is generated from the two pieces of input data S(n−1) and Sn.

Figure 9:
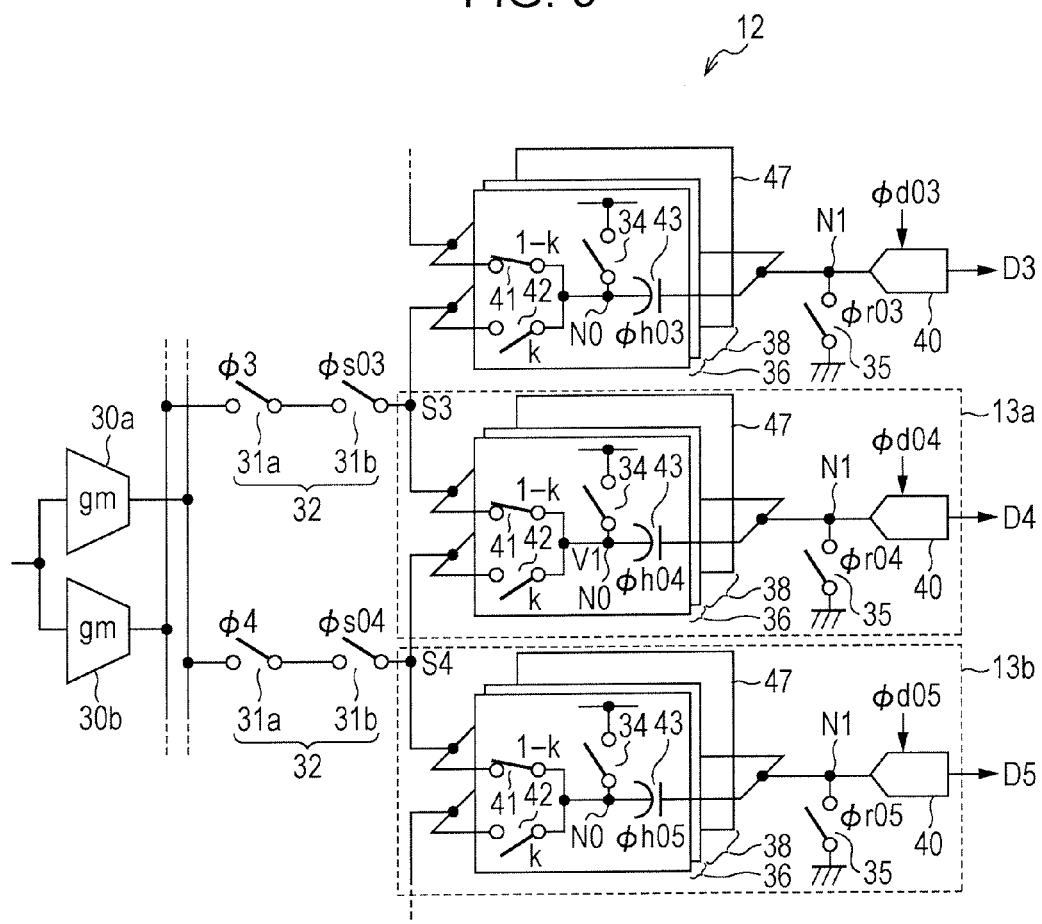
FIG. 9 is a circuit diagram illustrating an interpolation circuit according to a comparative example.

FIG. 9 is a circuit diagram illustrating an interpolation circuit according to a comparative example. With reference to FIG. 9, the interpolation circuit 12 includes the gm circuits 30a and 30b and a plurality of sampling circuits 13a and 13b. The sampling circuits 13a and 13b, which are adjacent to each other, share a switch 32. The switch 32 includes switches 31a and 31b, which are connected in series. Each of the sampling circuits 13a and 13b includes a plurality of (e.g., Nc: 32 in FIG. 9) slices 47. Each of the slices 47 includes switches 34, 41, and 42 and a capacitor 43. The switch 41 is connected between the switch 32 that outputs the input data S(n−1) (i.e., S3 in the sampling circuit 13a) and one end of the capacitor 43. The switch 42 is connected between the switch 32 that outputs the input data Sn (i.e., S4 in the sampling circuit 13a) and the one end of the capacitor 43. The other end of the capacitor 43 is connected to the output node N1. The switch 34, which is the same as the switch 34 illustrated in FIG. 6, is connected between the one end (node N0) of the capacitor 43 and a power supply Vcc. Note that the switch 34 is provided in each of the slices 47 in order to allow all of the capacitors 43 to be charged.

The Nc slices 47 are connected in parallel. The capacitance values of the capacitors 43 in the Nc slices 47 are the same as one another. The switches 41 and 42 are turned on or off complementarily. In other words, the switch 42 is off when the switch 41 is on, or the switch 42 is on when the switch 41 is off. Through this, the capacitors 43 of the slices 47 in which the switches 41 are turned on are connected in parallel to the switch 32 that corresponds to the input data S(n−1), and the capacitors 43 of these slices 47 correspond to the variable capacitor 36. Meanwhile, the capacitors 43 of the slices 47 in which the switches 42 are turned on are connected in parallel to the switch 32 that corresponds to the input data Sn, and the capacitors 43 of these slices 47 correspond to the variable capacitor 38. Thus, the sum of the capacitance values of the variable capacitor 36 and the variable capacitor 38 stays the same. The value of k is changed from 0 to 1, the switches 41 in the Nc×(1−k) slices 47, among the Nc slices 47, are turned on, and the Nc×k switches 42 are turned on. Through this, a voltage in proportion to (1−k)×S(n−1)+k×Sn is generated at the output node N1. The A/D 40 outputs the voltage at the node N1 as the interpolation data Dn.

Figure 10:
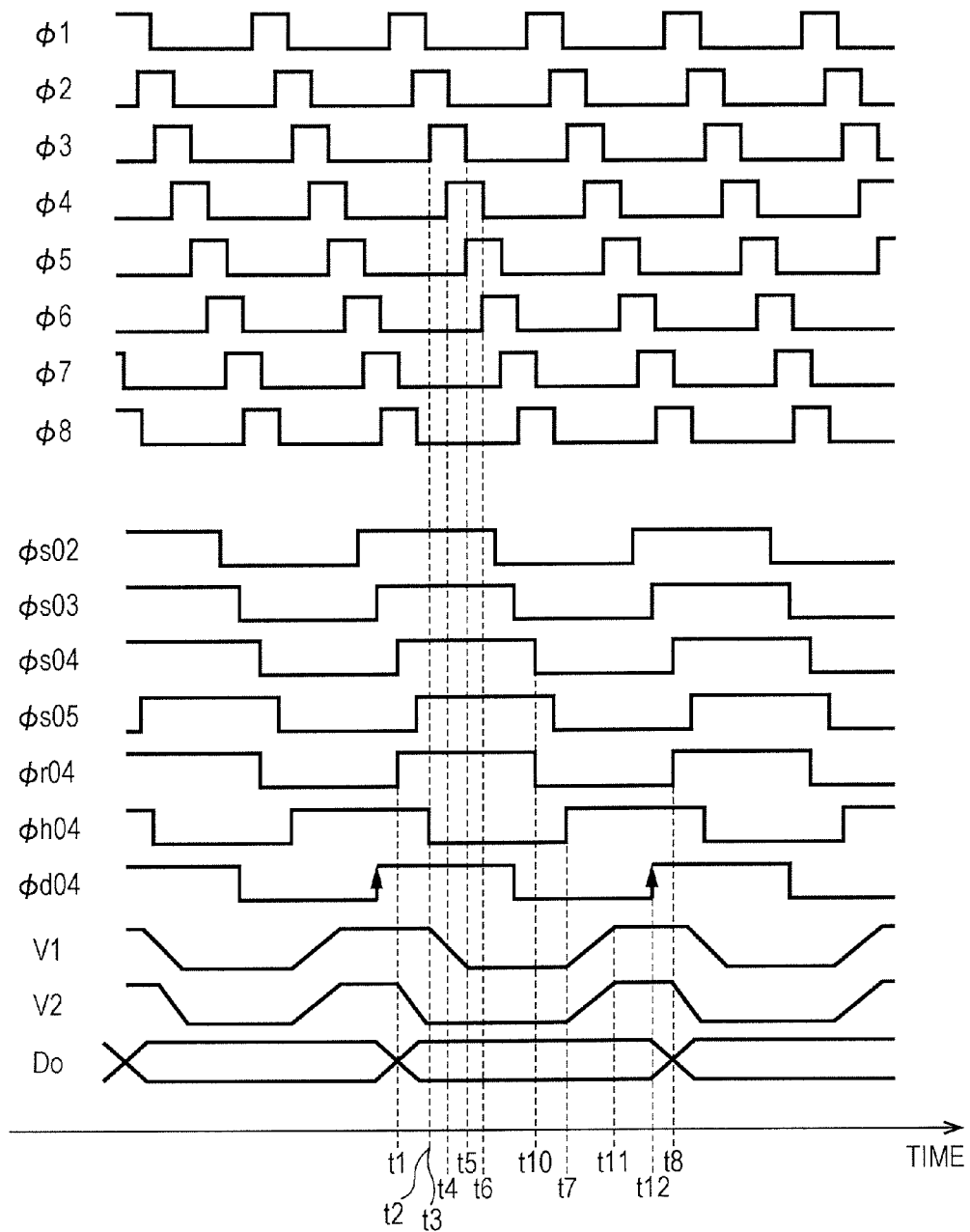
FIG. 10 is a timing chart according to a comparative example.

FIG. 10 is a timing chart according to the comparative example. A signal φn (φ1 to φ8 are illustrated in FIG. 10) serves to control the switch 31a. A signal φs0n (φs02 to φs05 are illustrated in FIG. 10) serves to control the switch 31b. Signals φr0n and φh0n serve to control the switches 35 and 34, respectively. A signal φd0n causes the A/D 40 to carry out the sampling. Signals φr04, φh04, and φd04 are illustrated in FIG. 10 as examples of the signals φr0n, φh0n, and φd0n, respectively. The signals φr0n, φh0n, and φd0n in which n is other than 4 are delayed as n increases, as in the case of the signals φn and φs0n. For example, the signal φr04 is identical to the signal φs04. The signal φh04 is identical to an inverted signal of the signal φs06. The signal φd04 is identical to the signal φs03.

Voltages V1 and V2 are voltages at the node N0 and the node N1, respectively. The high level of the voltage V1 corresponds to Vdd, and the low level of the voltage V2 corresponds to the ground. Do indicate the output data.

Similarly to the configuration illustrated in FIG. 5, the variable capacitors 36 and 38 are charged during a period from a time t1 to a time t2. At this time, the voltage V1 at the node N0 is at Vdd. The voltage V2 at the node N1 is at the ground. The switches 31a and 31b that correspond to S3 both become the high level during a period from a time t3 to a time t5. Through this, similarly to the configuration illustrated in FIG. 6, an electric charge in the variable capacitor 36 is discharged. The voltage V1 becomes a voltage that corresponds to the input data S3 at the time t5. The switches 31a and 31b that correspond to S4 both become the high level during a period from a time t4 to a time t6. Through this, similarly to the configuration illustrated in FIG. 7, an electric charge in the variable capacitor 38 is discharged. Similarly to the configuration illustrated in FIG. 8, the switch 35 is turned off and the switch 34 is turned on during a period from a time t7 to a time t8. Through this, the voltage V2 at the node N1 rises, and the voltage V2 becomes a voltage that corresponds to the interpolation data D4 at and after a time t11. The signal φd04 rises at a time t12, and the A/D 40 samples the voltage V2. The interpolation data D4 corresponds to boundary data of the output data Do. Other pieces of interpolation data Dn are generated in a similar manner.

In the comparative example, as illustrated in FIG. 9, the switches 41 and 42 are connected in series on a line through which a signal propagates. Thus, a loss in the signal occurs. In addition, the switches 41 and 42 are provided in each of the slices 47, and thus the number of switches increases. Furthermore, as illustrated in FIG. 10, the signals φ3 and φ4 are both turned on during a period between the time t2, at which the signal φh04 becomes the low level, and the time t10, at which the signal φr04 becomes the low level.

Hereinafter, an interpolation circuit in which an embodiment is employed in order to make an improvement to the comparative example described above will be described.

Figure 11:
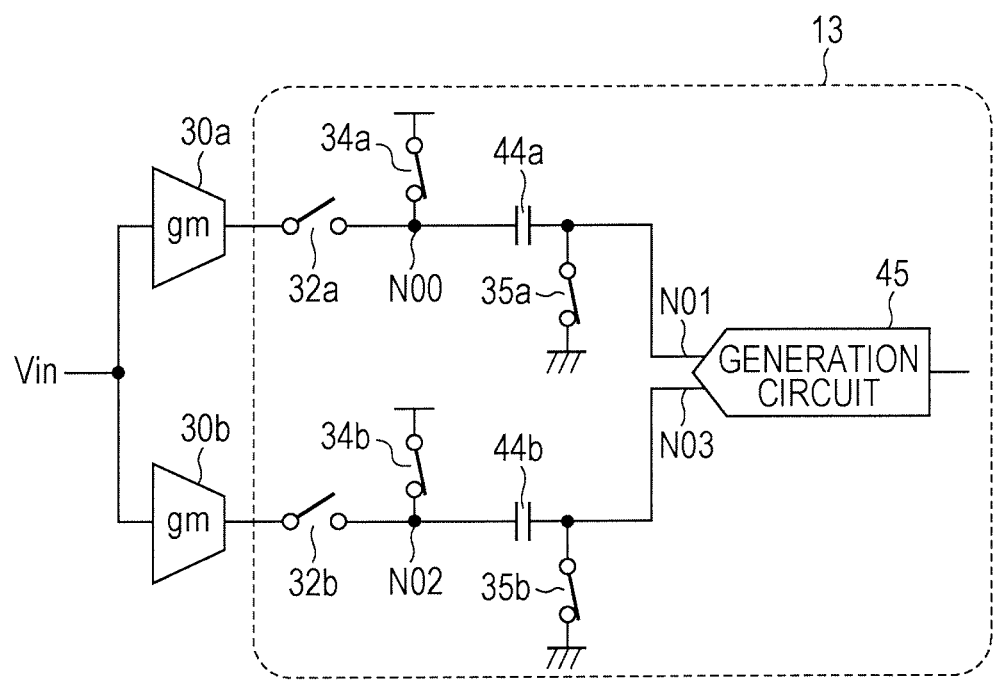
FIG. 11 is a block diagram illustrating part of an interpolation circuit in which an embodiment is employed.

FIG. 11 is a block diagram illustrating part of an interpolation circuit in which an embodiment is employed. With reference to FIG. 11, a circuit that generates a single piece of interpolation data from two temporally adjacent pieces of input data will be described. With reference to FIG. 11, the interpolation circuit 12 partially includes gm circuits 30a and 30b and a sampling circuit 13. The sampling circuit 13 includes switches 32a, 32b, 34a, 34b, 35a, and 35b, capacitors 44a and 44b, and a generation circuit 45. Each of the capacitors 44a and 44b is a capacitor with a fixed capacitance value. The gm circuit 30a, the switch 32a, and the capacitor 44a are electrically connected in series between an input Vin and a node N01. The gm circuit 30a serves as a voltage current conversion circuit that converts an input signal Vin into a current. The switch 32a is electrically connected between an output terminal of the gm circuit 30a and one end (node N00) of the capacitor 44a. The other end of the capacitor 44a is connected to the node N01. The switch 34a is electrically connected between the node N00 and a power supply Vdd. The switch 35a is electrically connected between the node N01 and a ground.

The gm circuit 30b, the switch 32b, and the capacitor 44b are electrically connected in series between the input Vin and a node N03. The gm circuit 30b serves as a voltage current conversion circuit that converts an input signal Vin into a current. The switch 32b is electrically connected between an output terminal of the gm circuit 30b and one end (node N02) of the capacitor 44b. The switch 34b is electrically connected between the node N02 and a power supply Vdd. The other end of the capacitor 44b is connected to the node N03. The switch 35b is electrically connected between the node N03 and a ground. The nodes N01 and N03 provide an input to the generation circuit 45. The generation circuit 45 weights and combines voltages at the nodes N01 and N03 in accordance with an interpolation code to thus generate interpolation data.

Figure 12:
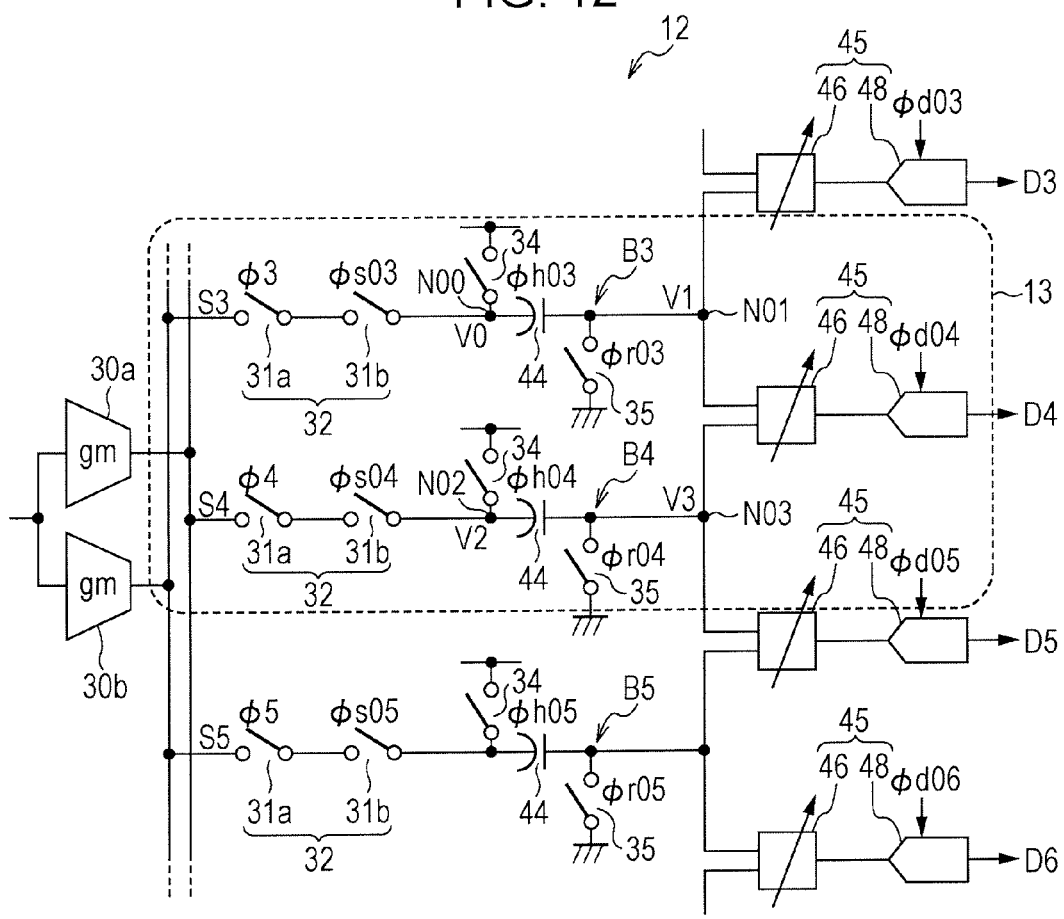
FIG. 12 is a circuit diagram illustrating an interpolation circuit in which an embodiment is employed.

FIG. 12 is a circuit diagram illustrating an interpolation circuit in which an embodiment is employed. With reference to FIG. 12, the interpolation circuit 12 includes the gm circuits 30a and 30b and a plurality of holding circuits Bn (n is a natural number, and B3 to B5 are illustrated in FIG. 12). Each of the holding circuits Bn includes switches 32, 34, and 35 and a capacitor 44 and holds input data Sn inputted in time series. The sampling circuit 13, which outputs interpolation data Dn, includes the holding circuits B(n−1) and Bn. For example, the sampling circuit 13 that outputs interpolation data D4 and the sampling circuit 13 that outputs interpolation data D5 share the holding circuit B4. Similarly to the configuration illustrated in FIG. 9, in each of the holding circuits Bn, the switch 32 includes switches 31a and 31b, which are connected in series. The generation circuit 45 includes a weighting circuit 46 and a decision circuit 48.

An electric charge in an amount equivalent to the corresponding input data Sn is accumulated in the capacitor 44 when the switch 32 is turned on. Thus, the voltages at the nodes N01 and N03 become the voltages V1 and V3 that correspond to the input data S3 and S4, respectively. The weighting circuit 46 combines the voltages V1 and V3 at the respective nodes N01 and N03 in accordance with the interpolation code. The decision circuit 48 compares the output of the weighting circuit 46 with a reference value so as to convert the output into a digital signal (high or low). Note that it is preferable that each of the capacitors 44 have substantially the same capacitance value.

Figure 13:
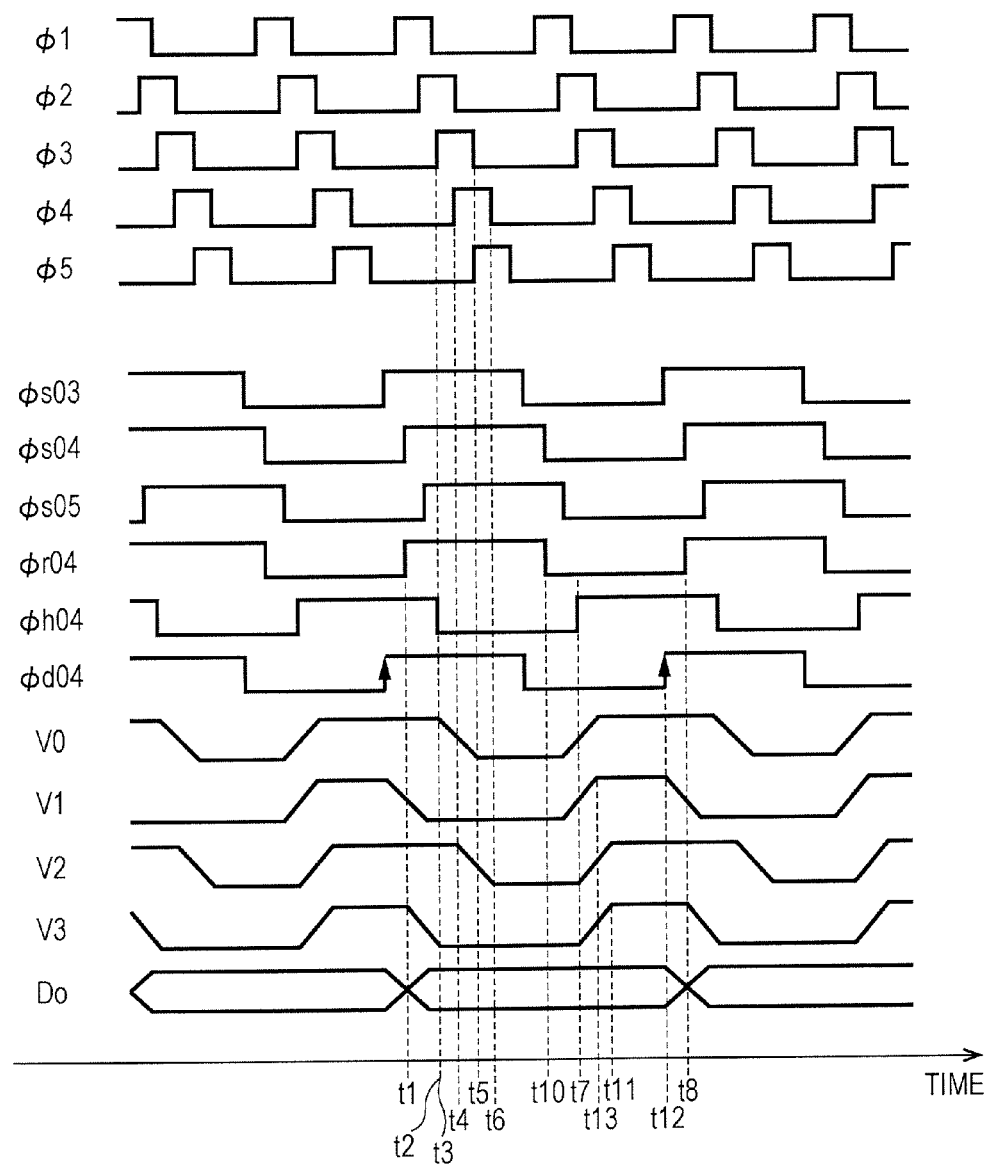
FIG. 13 is a timing chart of an interpolation circuit in which an embodiment is employed.

FIG. 13 is a timing chart of the interpolation circuit in which the embodiment is employed. A signal φn (φ1 to φ5 are illustrated in FIG. 13) serves to control the switch 31a in the holding circuit Bn. A signal φs0n (φs03 to φs05 are illustrated in FIG. 13) serves to control the switch 31b in the holding circuit Bn. Signals φr0n and φh0n serve to control the switches 35 and 34, respectively, in the holding circuit Bn. A signal φd0n is a sampling signal to be inputted to the decision circuit 48, which outputs the interpolation data Dn. The signals φr04, φh04, and φd04 are illustrated in FIG. 13 as examples of the signals φr0n, φh0n, and φd0n, respectively. The signals φr0n, φh0n, and φd0n in which n is other than 4 are delayed by a predetermined period as n increases, as in the case of the signals φn and φs0n. For example, the signal φr04 is identical to the signal φs04. The signal φh04 is identical to an inverted signal of the signal φs06. The signal φd04 is identical to the signal φs03.

Voltages V0 to V3 are voltages at the nodes N00 to N03, respectively. The high level of each of the voltages V0 and V2 corresponds to Vdd, and the low level of each of the voltages V1 and V3 corresponds to the ground. Do indicate the output data.

The signals φr04 and φh04 are each at the high level during a period from a time t1 to a time t2, and thus the switches 34 and 35 in the holding circuit B4 are turned on. Through this, the capacitor 44 in the holding circuit B4 is charged. At this time, the voltage V2 at the node N02 becomes Vdd, and the voltage V3 at the node N03 becomes a ground potential. Although not illustrated in FIG. 13, during a period in which the signals φr03 and φh03 are each at the high level, the voltage V0 at the node N00 in the holding circuit B3 becomes Vdd, and the voltage V1 at the node N01 becomes the ground potential. The signals φ3 and φs03 are each at the high level during a period from a time t3 to a time t5, and thus the switches 31a and 31b in the holding circuit B3 are both turned on. Through this, an electric charge in the capacitor 44 in the holding circuit B3 is discharged. The voltage V0 is at a voltage that corresponds to the input data S3 at the time t5. The switches 31a and 31b in the holding circuit B4 are both turned on during a period from a time t4 to a time t6. Through this, an electric charge in the capacitor 44 in the holding circuit B4 is discharged. The voltage V2 is at a voltage that corresponds to the input data S4 at the time t6.

The switch 35 is turned off and the switch 34 is turned on in the holding circuit B4 during a period from a time t7 to a time t8. Through this, the voltage V3 at the node N03 rises, and the voltage V3 is at a voltage that corresponds to the input data S4 at and after a time t11. Similarly, the voltage V1 is at a voltage that corresponds to the input data S3 at and after a time t13 in the holding circuit B3. The weighting circuit 46 weights and combines the voltages V1 and V3. When the signal φd04 rises at a time t12, the decision circuit 48 generates interpolation data from the combined voltage.

As illustrated in FIG. 13, the signals φn, φs0n, φr0n, φh0n, and φd0n are each delayed by a predetermined time as n increases by 1. Through this, the holding circuits Bn and the generation circuit 45 can generate interpolation data Dn successively from the input data S(n−1) and Sn. Such an operation is called a time interleaved operation.

In the comparative example, as illustrated in FIG. 9, the switch 32 that corresponds to the input data S3 and the switch 32 that corresponds to the input data S4 are connected to the switches 34 and 35 that correspond to the interpolation data D4. Therefore, as illustrated in FIG. 10, a pulse of the signal φ3 and a pulse of the signal φ4 are contained within a period between the time t2, at which the signal φh04 becomes the low level, and the time t10, at which the signal φr04 becomes the low level. In other words, during the period from the time t2 to the time t10, the signal φ3 becomes low, high, and low, and the signal φ4 becomes low, high, and low with a delay relative to the signal φ3.

Meanwhile, in the interpolation circuit in which the embodiment is employed, as illustrated in FIG. 12, only the switch 32 that corresponds to the input data S4 is connected to the switches 34 and 35 in the holding circuit B4. Therefore, as illustrated in FIG. 13, it is sufficient that only a pulse of the signal φ4 be contained within a period between the time t2, at which the signal φh04 becomes the low level, and the time t10, at which the signal φr04 becomes the low level. In other words, simply the signal φ4 may become low, high, and low during the period from the time t2 to the time t10. As the speed increases, it becomes more difficult to reduce a pulse duration of the signal φn relative to the pulse durations of the signals φh0n and φr0n. According to an embodiment associated with FIG. 14, a margin in a pulse duration can be increased, as compared to the comparative example. Accordingly, it becomes possible to respond to an increase in speed.

According to the interpolation circuit in which the embodiment is employed, as illustrated in FIGS. 12 and 13, the plurality of holding circuits Bn hold a plurality of pieces of input data, respectively, that are inputted in time series. The weighting circuit 46 of the generation circuit 45 weights and combines two temporally adjacent pieces of input data held by the corresponding holding circuits Bn among the plurality of holding circuits Bn in accordance with the interpolation code. The decision circuit 48 of the generation circuit 45 generates the interpolation data from the combined data. For example, the decision circuit 48 compares the output of the weighting circuit 46 with the reference value and decides between high and low to thus generate digital data of the interpolation data. In this manner, the holding circuits Bn each hold temporally different input data, and the generation circuit 45 generates the interpolation data on the basis of such input data and the interpolation code. Such a configuration makes the switches 41 and 42 illustrated in FIG. 9 unnecessary. Thus, an increase in impedance to be caused by the switches 41 and 42 is suppressed, making it possible to suppress a signal loss. In addition, since the switches 41 and 42 and the capacitor 43 are not provided in each of the slices 47, the area of the circuit can be reduced. Furthermore, as described with reference to FIG. 13, since it is sufficient that a single pulse of the signal φn be contained within the period from the time t2 to the time t10, a margin in the pulse duration can be increased. This in turn makes it possible to achieve a higher speed circuit.

Although a case in which each of the holding circuits Bn includes the capacitor 44 that accumulates an electric charge in an amount corresponding to the voltage of the input data Sn has been described, it is sufficient that the plurality of holding circuits Bn hold the input data. When the capacitor 44 is used, by setting the capacitance values of the plurality of capacitors 44 to be the same as one another, the interpolation data can be generated with ease.

As illustrated in FIG. 12, each of the switches 34 is connected in series between the one end of the corresponding one of the capacitors 44 and Vdd in the holding circuit Bn. Each of the switches 35 is connected in series between the other end of the corresponding one of the capacitors 44 and the ground. Each of the switches 32 (third switches) applies a current corresponding to the given input data Sn to the one end of the corresponding one of the capacitors 44. Through this, the capacitor 44 can accumulate an electric charge in an amount corresponding to the input data Sn.

As illustrated in FIG. 13, for each of the capacitors 44, an on period (period in which the signal φn is high) of the switch 32 is contained within a period in which the switch 34 is off (φh0n is low) and the switch 35 is on (φr0n is high). In this manner, it is sufficient that a single pulse of the signal φn be contained within a period from the time t2 to the time t10.

As described above, the generation circuit 45 includes the weighting circuit 46 and the decision circuit 48. Hereinafter, embodiments that make it possible to reduce the size of the generation circuit 45 that includes the weighting circuit 46 and the decision circuit 48 will be described.

Figure 14:
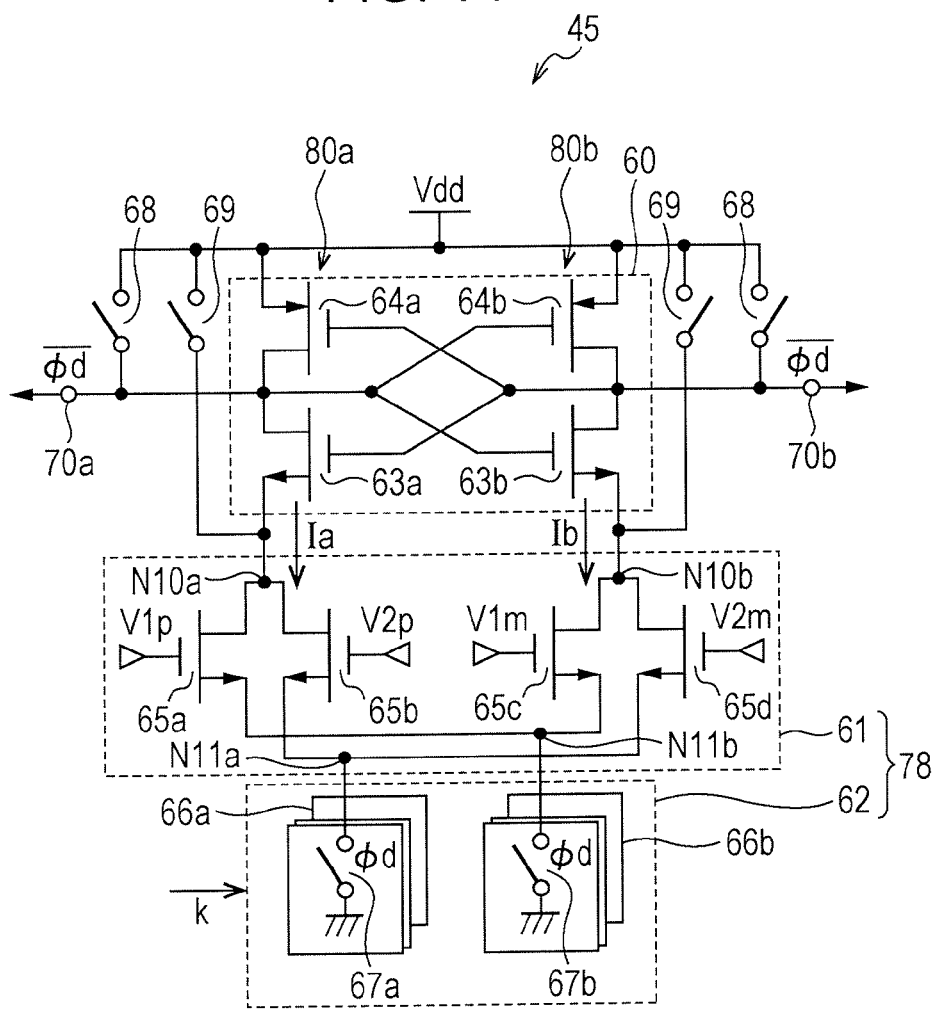
FIG. 14 is a circuit diagram illustrating an electronic circuit.

FIG. 14 is a circuit diagram illustrating an electronic circuit according to an embodiment. With reference to FIG. 14, the generation circuit 45 includes a decision circuit 60 and a weighting circuit 78. The decision circuit 60 is, for example, a latch circuit. The weighting circuit 78 includes a transistor 61 and a current source 62. The decision circuit 60 includes inverters 80a and 80b (first inverter and second inverter). The inverters 80a and 80b include n-type field-effect transistors (FETs) 63a and 63b, respectively, and p-type FETs 64a and 64b, respectively. Drains of the FETs 63a and 64a are connected in common so as to serve as an output node of the inverter 80a. Gates of the FETs 63a and 64a are connected in common so as to serve as an input node of the inverter 80a. Sources of the FETs 63a and 64a are connected to a node N10a and a power supply Vdd (first power supply), respectively. The inverter 80b is configured in a similar manner.

The output node of the inverter 80a is connected to the input node of the inverter 80b. The output node of the inverter 80b is connected to the input node of the inverter 80a. The output nodes of the inverters 80a and 80b are connected, respectively, to output terminals 70a and 70b of the generation circuit 45. The pair of the output terminals 70a and 70b outputs complementary signals. A switch 68 is turned on when an inverted signal of a signal φd (inverted signal of the signal φn04 in FIGS. 12 and 13) becomes the high level (the signal φd is at the low level) and outputs data held in the decision circuit 60 through a corresponding one of the output terminals 70a and 70b. A switch 69, when being turned off, activates the generation circuit 45.

The transistor 61 includes four n-type FETs 65a to 65d (first to fourth transistors). Drains (first terminals) of the FETs 65a and 65b are connected in common to the node N10a (first node). Drains of the FETs 65c and 65d are connected in common to a node N10b (second node). Sources (second terminals) of the FETs 65a and 65c are connected in common to a node N11b (fourth node). Sources of the FETs 65b and 65d are connected in common to a node N11a (third node). Voltage signals V1p, V2p, V1m, and V2m are inputted to gates (control terminals) of the FETs 65a to 65d, respectively. The voltages V1p and V2p correspond, for example, to the voltages V1 and V3, respectively, illustrated in FIGS. 12 and 13. The voltages V1m and V2m are inverted signals of the voltages V1p and V2p, respectively.

The current source 62 includes a plurality of slices 66a (first switches) and a plurality of slices 66b (second switches). Each of the slices 66a is provided with a switch 67a that connects the node N11a with a ground (second power supply: a power supply that supplies a voltage different from that of the power supply Vdd). In other words, a plurality of switches 67a are connected in parallel between the node N11a and the ground. Each of the slices 66b is provided with a switch 67b that connects the node N11b with the ground. In other words, a plurality of switches 67b are connected in parallel between the node N11b and the ground. The switches 67a and 67b are each turned on in synchronization with the signal φd. Here, the signal φd corresponds, for example, to the signal φd0n illustrated in FIGS. 12 and 13. A coefficient k (e.g., interpolation code), which can be modified, is inputted to the weighting circuit 78. A switch to be turned on is set among the switches 67a and 67b in accordance with the variable coefficient k.

For example, in the case in which the Nc slices 66a and the Nc slices 66b are provided, the switches 67a of the k (k is between 0 and 1)×Nc slices 66a synchronize with the signal φd. The switches 67a of the remaining slices 66a are off irrespective of the signal φd. The switches 67b of the (1−k)× Nc slices 66b synchronize with the signal φd. The switches 67b of the remaining slices 66b are off irrespective of the signal φd.

When current voltage characteristics of the FETs 65a to 65d are linear, a current Ia that flows through the node N10a is A0×((1−k)×S(n−1)+k×Sn)+I0. Meanwhile, a current Ib that flows through the node N10b is −A0×((1−k)×S(n−1)+k× Sn)+I0. Here, A0 is a fixed coefficient, and I0 is a current that flows through the node N10a (or the node N10b) when the voltages V1p and V2p (or V1m and V2m) are 0. Thus, the decision circuit 60 can decide whether (1−k)×S(n−1)+k×Sn is high or low by comparing a potential at the node N10a with a potential at the node N10b. Through this, interpolation data, which is a digital signal obtained by subjecting Dn=(1−k)×S (n−1)+k×Sn to A/D conversion, is generated. In this manner, by using the generation circuit 45 illustrated in FIG. 14 in the interpolation circuit illustrated in FIG. 12, processing of an interpolation circuit similar to that of the comparative example can be achieved.

Figure 15:
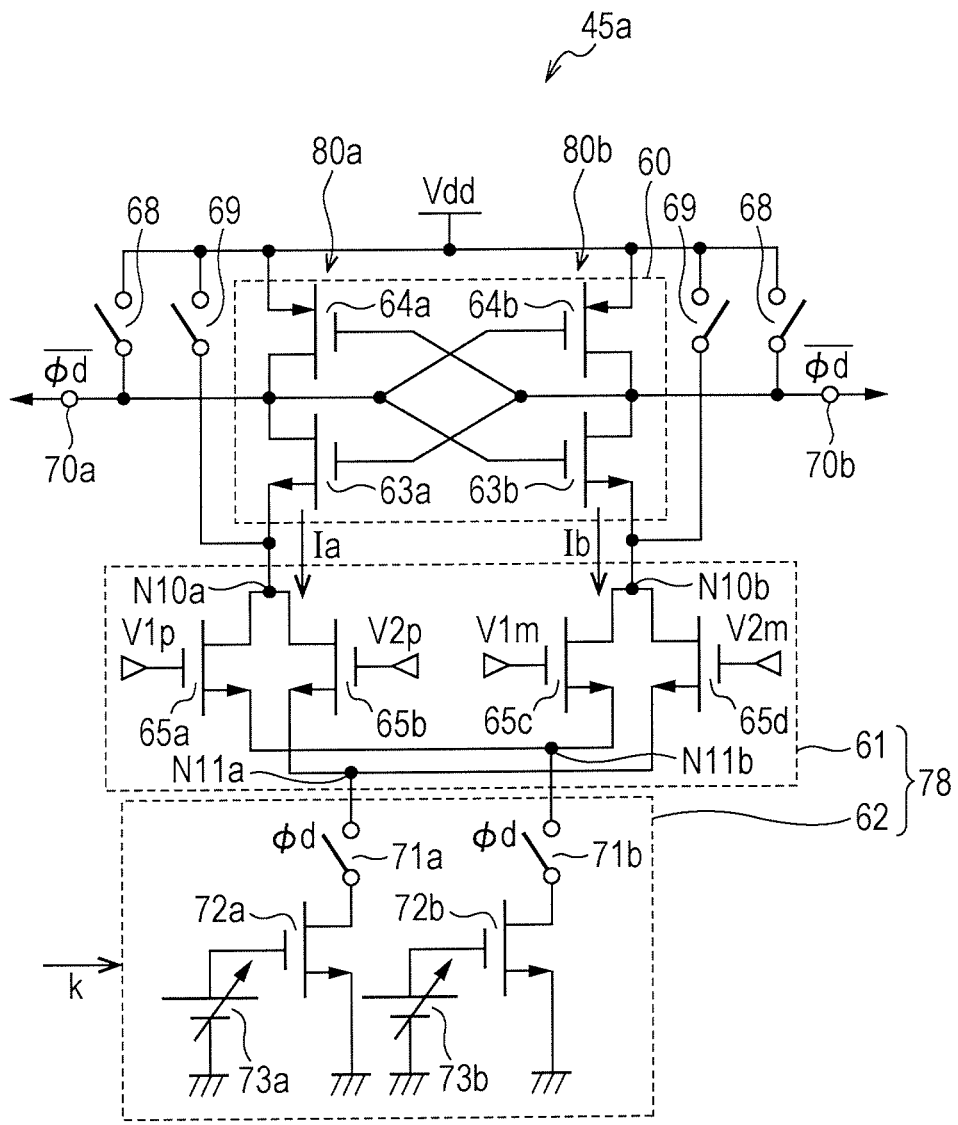
FIG. 15 is a circuit diagram illustrating an electronic circuit.

FIG. 15 is a circuit diagram illustrating an electronic circuit. With reference to FIG. 15, in a generation circuit 45a, the current source 62 includes switches 71a and 71b, FETs 72a and 72b, and variable power supplies 73a and 73b. A drain (first terminal) of the FET 72a (fifth transistor) is connected to the node N11a via the switch 71a. A drain of the FET 72b (sixth transistor) is connected to the node N11b via the switch 71b. Each of the switches 71a and 71b is turned on or off in synchronization with the signal φd. Sources (second terminals) of the FETs 72a and 72b are connected to the ground. Control signals (first control signal and second control signal) are inputted to gates of the FETs 72a and 72b from the variable power supplies 73a and 73b, respectively. Voltages at the variable power supplies 73a and 73b are controlled in accordance with the coefficient k. Through this, currents that flow through the nodes N11a and N11b can be varied, as in the current source 62 illustrated in FIG. 14. Other configurations are the same as those illustrated in FIG. 14, and thus descriptions thereof will be omitted.

Figure 16:
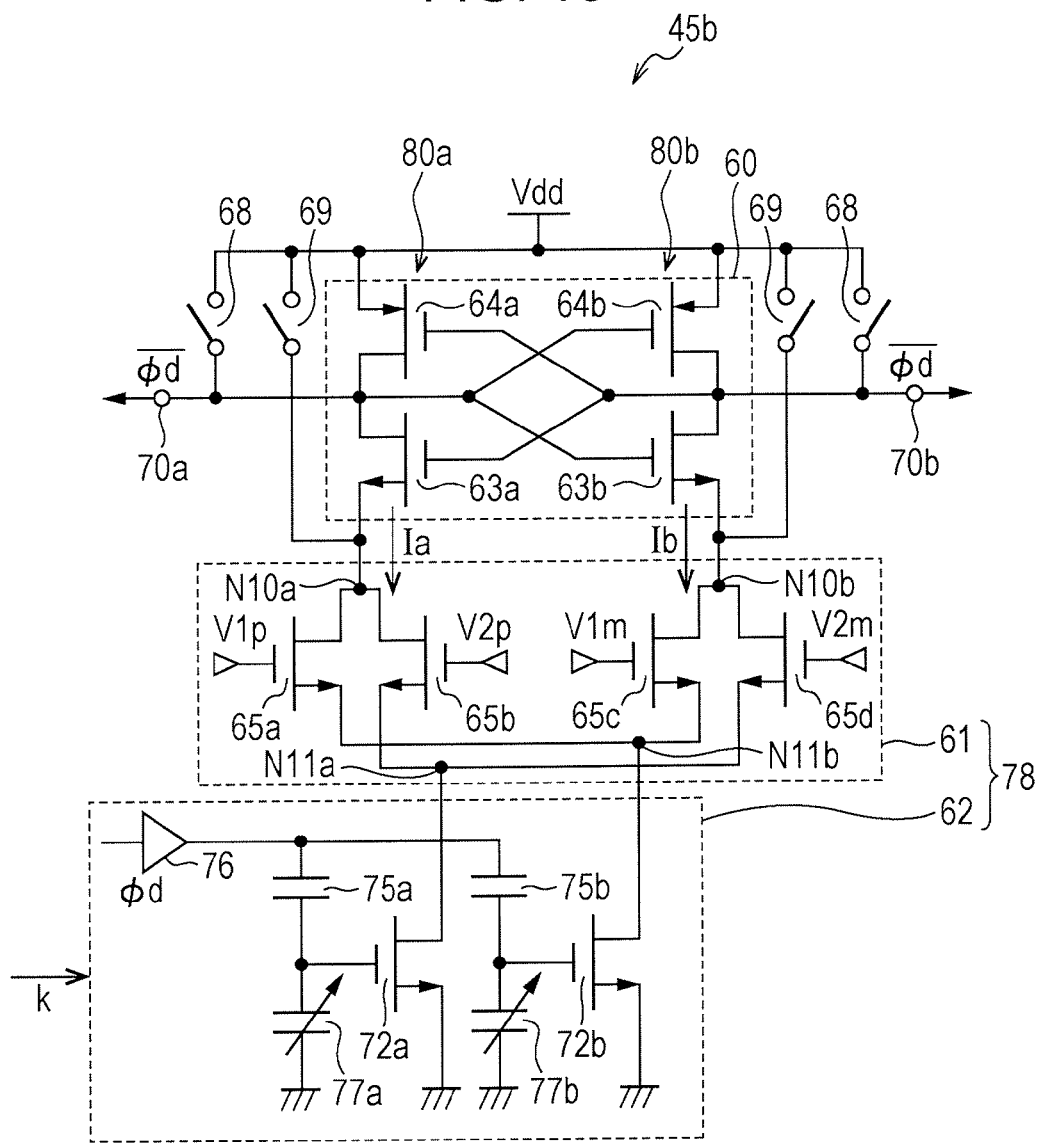
FIG. 16 is a circuit diagram illustrating an electronic circuit.

FIG. 16 is a circuit diagram illustrating an electronic circuit according to an embodiment. With reference to FIG. 16, in a generation circuit 45b, the current source 62 includes the FETs 72a and 72b, variable capacitors 77a and 77b, capacitors 75a and 75b, and an amplifier 76. The drains of the FETs 72a and 72b are connected to the nodes N11a and N11b, respectively. The sources of the FETs 72a and 72b are connected to the ground. The variable capacitors 77a and 77b are connected respectively between the gates of the FETs 72a and 72b and the grounds. In addition, the capacitors 75a and 75b are connected respectively between the gates of the FETs 72a and 72b and an output of the amplifier 76. The amplifier 76 amplifies the signal φd and outputs the result. The capacitor 75a and the variable capacitor 77a divide the output voltage of the amplifier 76 in accordance with the ratio between the capacitance values of the capacitor 75a and the variable capacitor 77a, and the result is applied to the gate of the FET 72a. The capacitor 75b and the variable capacitor 77b divide the output voltage of the amplifier 76 in accordance with the ratio between the capacitance values of the capacitor 75b and the variable capacitor 77b, and the result is applied to the gate of the FET 72b. By controlling the capacitance values of the variable capacitors 77a and 77b in accordance with the coefficient k, the currents that flow through the nodes N11a and N11b can be varied in accordance with the interpolation code, as in the current source 62 illustrated in FIG. 14. Other configurations are the same as those illustrated in FIG. 14, and thus descriptions thereof will be omitted.

Figure 17:
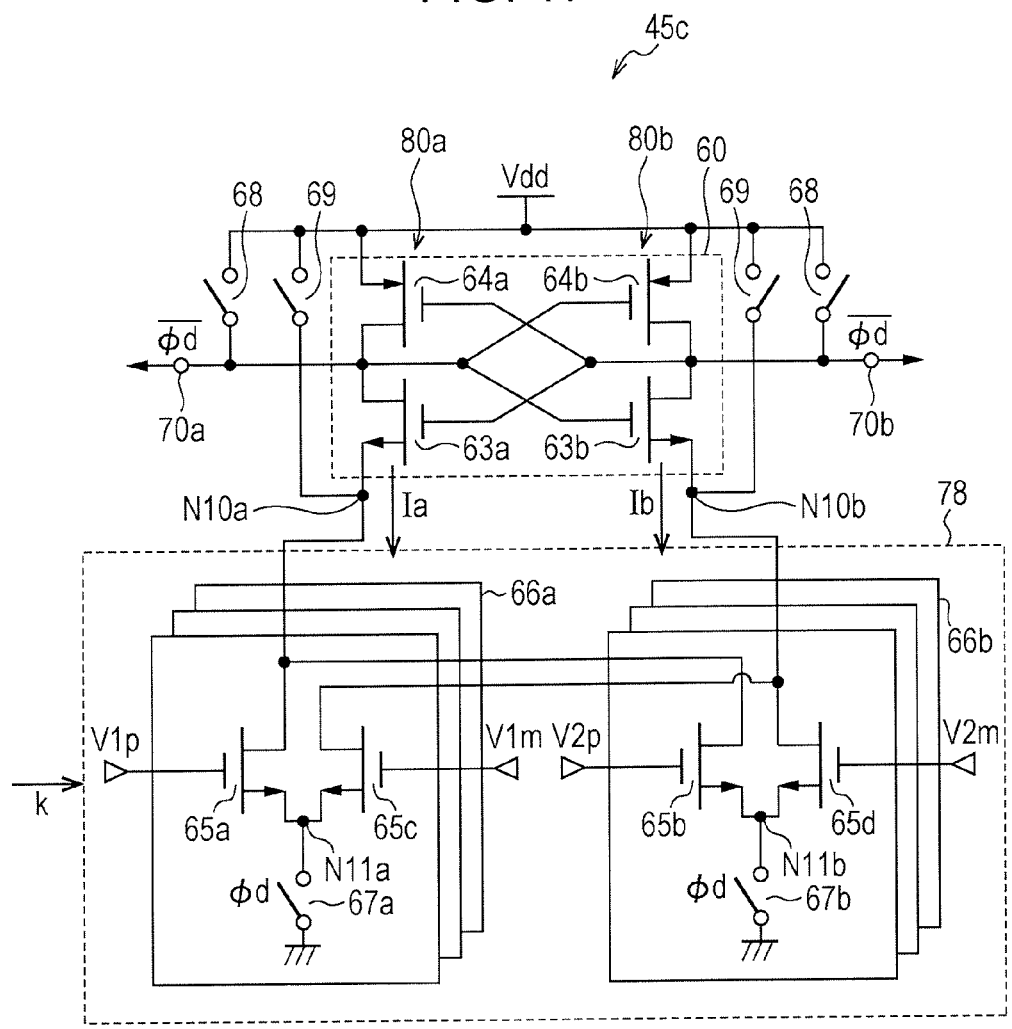
FIG. 17 is a circuit diagram illustrating an electronic circuit.

FIG. 17 is a circuit diagram illustrating an electronic circuit according to an embodiment. With reference to FIG. 17, in a generation circuit 45c, the weighting circuit 78 includes the plurality of slices 66a (first slice circuits) and the plurality of slices 66b (second slice circuits). Each of the slices 66a includes the FETs 65a and 65c and the switch 67a. In the plurality of slices 66a, the drains of the FETs 65a are connected in common to the node N10a. The signal V1p is inputted in common to the gates of the FETs 65a. The source of the FET 65a is connected to the node N11a in each of the slices 66a. The drains of the FETs 65c are connected in common to the node N10b. The signal V1m is inputted in common to the gates of the FETs 65c. The source of the FET 65c is connected to the node N11a in each of the slices 66a. The switch 67a is connected between the node N11a and the ground in each of the slices 66a.

Each of the slices 66b includes the FETs 65b and 65d and the switch 67b. In the plurality of slices 66b, the drains of the FETs 65b are connected in common to the node N10a. The signal V2p is inputted in common to the gates of the FETs 65b. The source of the FET 65b is connected to the node N11b in each of the slices 66b. The drains of the FETs 65d are connected in common to the node N10b. The signal V2m is inputted in common to the gates of the FETs 65d. The source of the FET 65d is connected to the node N11b in each of the slices 66b. The switch 67b is connected between the node N11b and the ground in each of the slices 66b.

On the basis of the coefficient k, for example, the switches 67a in the Nc×k slices 66a are turned on, and the switches 67a in the remaining slices 66a are turned off. For example, the switches 67b in the Nc×(1−k) slices 66b are turned on, and the switches 67b in the remaining slices 66b are turned off. Through this, a decision on (1−k)×S(n−1)+k×Sn can be made, as in the embodiment illustrated in FIG. 14. The configuration of the decision circuit 60 is the same as that of the decision circuit 60 illustrated in FIG. 14, and thus descriptions thereof will be omitted.

In addition, in the embodiment illustrated in FIG. 16, the FETs 65a and 65c is provided in each of the slices 66a and the FETs 65b and 65d are provided in each of the slices 66b. Thus, it becomes easier to adjust the currents Ia and Ib that flow through the nodes N10a and N10b, respectively, as compared with the embodiment illustrated in FIG. 14.

Figure 18:
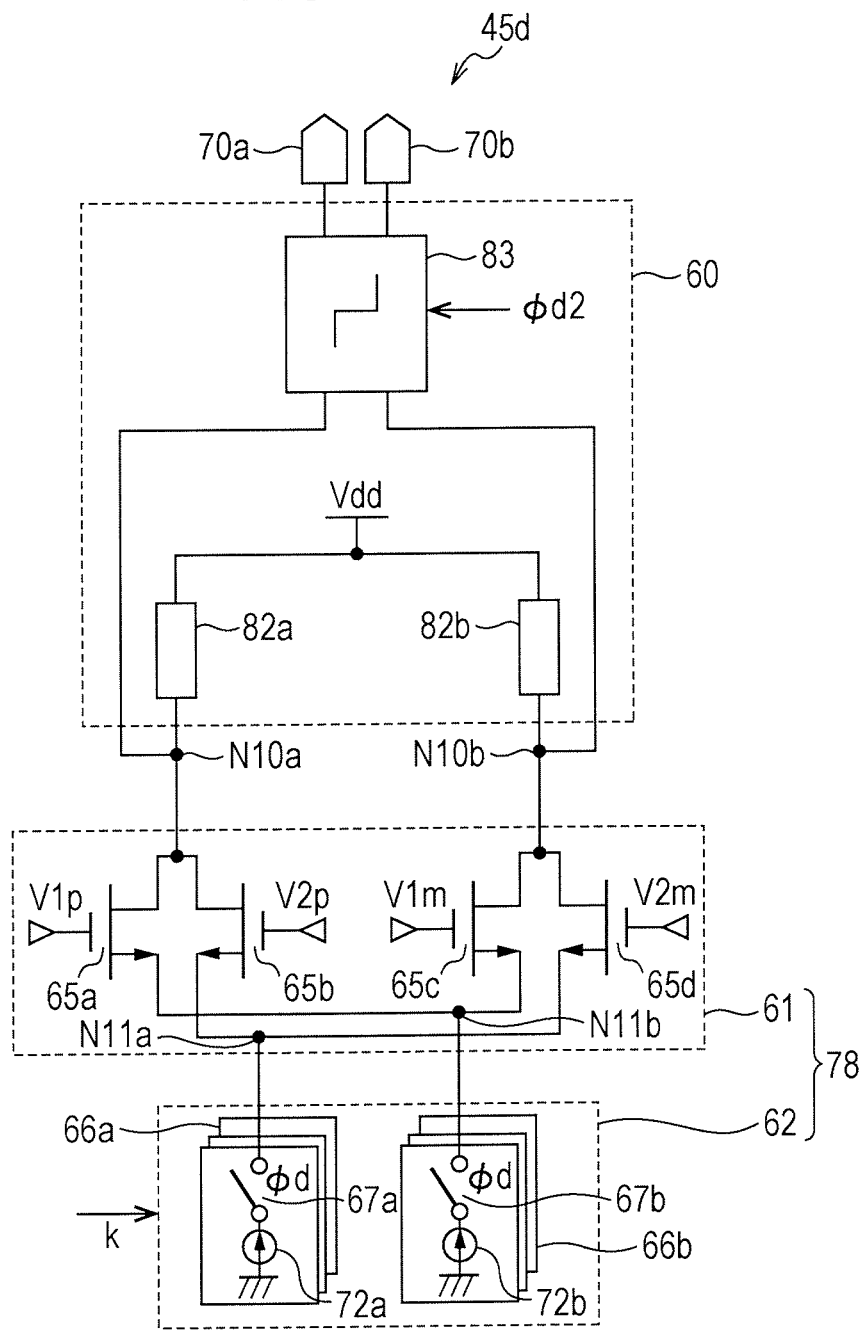
FIG. 18 is a circuit diagram illustrating an electronic circuit.

FIG. 18 is a circuit diagram illustrating an electronic circuit according to an embodiment. With reference to FIG. 18, in a generation circuit 45d, the decision circuit 60 includes a latch circuit 83 and loads 82a and 82b. The load 82a (third load) is connected at one end thereof to a power supply Vdd and at the other end thereof to the node N10a. The load 82b (fourth load) is connected at one end thereof to the power supply Vdd and at the other end thereof to the node N10b. The nodes N10a and N10b are connected to input terminals of the latch circuit 83. The latch circuit 83 holds the voltages at the nodes N10a and N10b in synchronization with a signal φd2 that is delayed relative to the signal φd for turning on the switches 67a and 67b. Output signals are outputted from the latch circuit 83 through the output terminals 70a and 70b. The configuration of the transistor 61 is the same as that of the transistor 61 illustrated in FIG. 14, and thus descriptions thereof will be omitted. In the current source 62, the current sources 72a and 72b are connected respectively between the switches 67a and 67b and the grounds. Other configurations are the same as those illustrated in FIG. 14, and thus descriptions thereof will be omitted.

Figure 19:
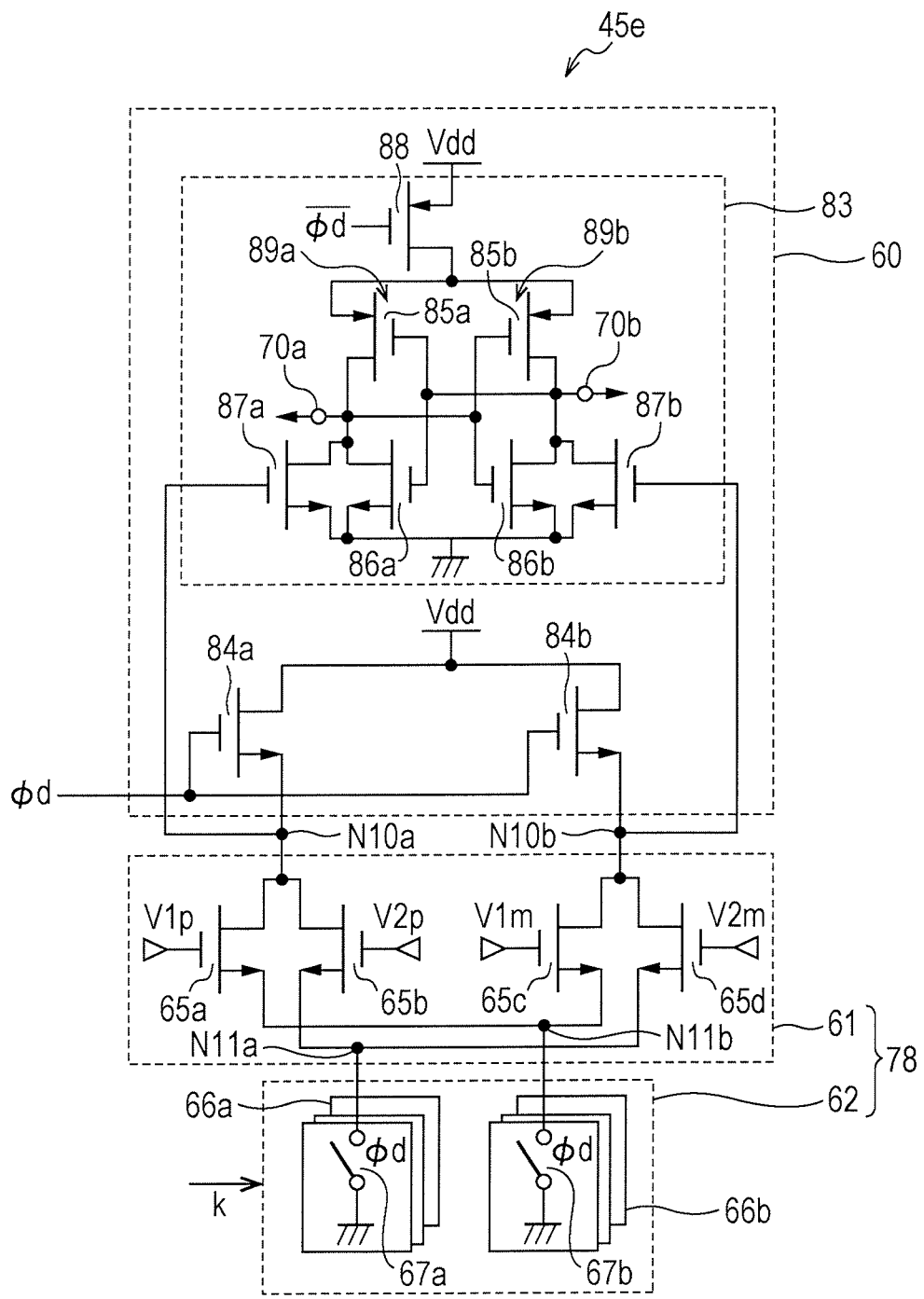
FIG. 19 is a circuit diagram illustrating an electronic circuit.

FIG. 19 is a circuit diagram illustrating an electronic circuit. With reference to FIG. 19, in a generation circuit 45e, the decision circuit 60 includes the latch circuit 83 and n-type FETs 84a and 84b. The FET 84a is connected between the node N10a and a power supply Vdd. The FET 84b is connected between the node N10b and the power supply Vdd. The clock signal φd is inputted to gates of the FETs 84a and 84b.

The latch circuit 83 includes p-type FETs 85a, 85b, and 88 and n-type FETs 86a, 86b, 87a, and 87b. The FETs 85a and 86a form an inverter 89a (first inverter), and the FETs 85b and 86b form an inverter 89b (second inverter). The FET 87a is connected in parallel to the FET 86a. In other words, the sources thereof are connected in common, and the drains thereof are connected in common. A gate (control terminal) of the FET 87a is connected to the node N10a. The FET 87b is connected in parallel to the FET 86b. A gate of the FET 87b is connected to the node N10b. The FET 88 is connected between sources of the FETs 85a and 85b and a power supply Vdd, and a complementary signal of the clock signal φd is inputted to a gate of the FET 88. The configurations of the transistor 61 and the current source 62 are the same as those of the transistor 61 and the current source 62 of the embodiment illustrated in FIG. 14, and thus descriptions thereof will be omitted.

Potentials at the nodes N10a and N10b cause the balance between the inverters 89a and 89b to change. Through this, a decision on the interpolation data can be made by comparing the currents that flow through the nodes N10a and N10b. The generation circuit 45e becomes active when the clock signal φd is high.

According to the embodiments associated with FIGS. 14 to 19, the weighting circuit 78 weights and combines the signal V1p (first input signal) and the signal V2p (second input signal) in accordance with the coefficient k so as to generate the current Ia (first current). In addition, the weighting circuit 78 weights and combines the signal V1m (first inverted signal), which is an inverted signal of the signal V1p, and the signal V2m (second inverted signal), which is an inverted signal of the signal V2p, in accordance with the coefficient k so as to generate the current Ib (second current). The decision circuit 60 makes a decision on the output signal in the form of a digital signal by comparing the current Ia with the current Ib. Through this, the size of the decision circuit to be used in the interpolation circuit illustrated in FIG. 12 can be reduced. In this manner, the size of the circuit that carries out weighting of and makes a decision on the data can be reduced.

In addition, in the embodiments illustrated in FIGS. 14 to 16, 18, and 19, the sources of the FETs 65b and 65d are connected in common to the node N11a, and the sources of the FETs 65a and 65c are connected in common to the node N11b. The current source 62 modifies the ratio between the current that flows through the node N11a and the current that flows through the node N11b in accordance with the coefficient k. In this manner, tail currents of the FETs 65a to 65d are modified in accordance with the coefficient k. Through this, the currents Ia and Ib can be made to flow through the nodes N10a and N10b, respectively.

Furthermore, the current source 62 includes a first load that is connected in parallel between the node N11a and the ground and a second load that is connected in parallel between the node N11b and the ground. The impedance ratio between the first load and the second load is modified in accordance with the coefficient k. Through this, tail currents of the FETs 65a to 65d can be modified in accordance with the coefficient k.

As described in the embodiment illustrated in FIG. 14, the first load includes the plurality of switches 67a, and the second load includes the plurality of switches 67b. The ratio between the number of the switches 67a, among the plurality of switches 67a, that are turned on and the number of the switches 67b, among the plurality of switches 67b, that are turned on is modified in accordance with the coefficient k. Through this, the ratio between the first load and the second load can be modified in accordance with the coefficient k.

As described in the embodiments illustrated in FIGS. 15 and 16, the first load includes the FET 72a, and the second load includes the FET 72b. The ratio between the control signals to be inputted to the FETs 72a and 72b is modified in accordance with the coefficient k. Through this, the impedance ratio between the first load and the second load can be modified in accordance with the coefficient k. In addition, the current ratio is controlled on the basis of the voltage ratio between the control signals, which in turn enables control with high precision.

As described in the embodiment illustrated in FIG. 17, the ratio between the number of the slices 66a, among the plurality of slices 66a, in which the switches 67a are turned on and the number of slices 66b, among the plurality of slices 66b, in which the switches 67b are turned on is modified in accordance with the coefficient k. Through this, the ratio between the currents Ia and Ib that flow through the nodes N10a and N10b, respectively, can be modified in accordance with the coefficient k.

As described in the embodiments illustrated in FIGS. 14 to 17, the decision circuit 60 includes a bistable circuit that includes the inverters 80a and 80b. In the inverter 80a, a first power supply terminal is connected to Vdd, and a second power supply terminal is connected to the node N10a. In the inverter 80b, a first power supply terminal is connected to Vdd, and a second power supply terminal is connected to the node N10b. Through this, the two nodes of the bistable circuit become high or low in accordance with the ratio between currents that flow through the nodes N10a and N10b. Thus, a decision between high or low of the output signal can be made on the basis of the ratio between the currents that flow through the nodes N10a and N10b.

As described in the embodiments illustrated in FIGS. 18 and 19, the decision circuit 60 decides between high and low of the output signal by comparing the potentials at the nodes N10a and N10b. In this manner, the currents Ia and Ib may be compared with each other in terms of the potentials at the corresponding nodes N10a and N10b.

As described in the embodiment illustrated in FIG. 19, the node N10a is connected to the gate of the FET 87a, which is connected in parallel to one FET 86a of the inverter 89a. The node N10b is connected to the gate of the FET 87b, which is connected in parallel to one FET 86b of the inverter 89b. Through this, imbalance in potentials between the nodes N10a and N10b causes imbalance in potential at a bistable point in the bistable circuit, which makes it possible to decide between high and low of the output signal.

The FETs in the embodiments illustrated in FIGS. 14 to 19 may be modified, as appropriate, between n-type FETs and p-type FETs. It is preferable that the sizes (e.g., gate widths) of the FETs 65a to 65d be substantially the same. It is preferable that the on resistances of the switches 67a and 67b be substantially the same.

Although examples in which the electronic circuits of the embodiments associated with FIGS. 14 to 19 are used in the interpolation circuit have been described, the electronic circuit may be used in a circuit aside from the interpolation circuit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic circuit, comprising:
a weighting circuit configured to generate, based on a modifiable coefficient, a first current by weighting and combining a first input signal and a second input signal and to generate, based on the coefficient, a second current by weighting and combining a first inverted signal and a second inverted signal, the first inverted signal being an inverted signal of the first input signal, the second inverted signal being an inverted signal of the second input signal; and
a decision circuit configured to decide on an output signal by comparing the first current with the second current.

2. The electronic circuit according to claim 1,
wherein the weighting circuit includes
a first transistor having a first terminal and a control terminal, the first terminal being connected to a first node that is connected to a first power supply, the control terminal being configured to accept input of the first input signal,
a second transistor having a first terminal and a control terminal, the first terminal being connected to the first node, the control terminal being configured to accept input of the second input signal,
a third transistor having a first terminal and a control terminal, the first terminal being connected to a second node that is connected to the first power supply, the control terminal being configured to accept input of the first inverted signal,
a fourth transistor having a first terminal and a control terminal, the first terminal being connected to the second node, the control terminal being configured to accept input of the second inverted signal, and
a current source configured to modify, in accordance with the coefficient, a ratio between a current that flows through a third node to which second terminals of the first transistor and the third transistor are connected in common and a current that flows through a fourth node to which second terminals of the second transistor and the fourth transistor are connected in common.

3. The electronic circuit according to claim 2,
wherein the current source includes
a first load connected between the third node and a second power supply, the second power supply being configured to supply a voltage that is different from a voltage of the first power supply, and
a second load connected between the fourth node and the second power supply, and
wherein an impedance ratio between the first load and the second load is modified in accordance with the coefficient.

4. The electronic circuit according to claim 3,
wherein the first load includes a plurality of first switches connected in parallel between the third node and the second power supply, wherein the second load includes a plurality of second switches connected in parallel between the fourth node and the second power supply, and wherein a ratio between the number of first switches, among the plurality of first switches, that are turned on and the number of second switches, among the plurality of second switches, that are turned on is modified in accordance with the coefficient.

5. The electronic circuit according to claim 3, wherein the first load includes a fifth transistor having a first terminal, a second terminal, and a control terminal, the first terminal being connected to the third node, the second terminal being connected to the second power supply, the control terminal being configured to accept input of a first control signal, wherein the second load includes a sixth transistor having a first terminal, a second terminal, and a control terminal, the first terminal being connected to the fourth node, the second terminal being connected to the second power supply, the control terminal being configured to accept input of a second control signal, and wherein a ratio between the first control signal and the second control signal is modified in accordance with the coefficient.

6. The electronic circuit according to claim 1, wherein the weighting circuit includes a plurality of first slice circuits and a plurality of second slice circuits, wherein each of the first slice circuits includes a first transistor having a first terminal and a control terminal, the first terminal being connected to a first node that is connected to a first power supply, the control terminal being configured to accept input of the first input signal, a third transistor having a first terminal and a control terminal, the first terminal being connected to a second node that is connected to the first power supply, the control terminal being configured to accept input of the first inverted signal, a first switch connected between a third node to which second terminals of the first transistor and the third transistor are connected in common and a second power supply configured to supply a voltage that is different from a voltage of the first power supply, wherein each of the second slice circuits includes a second transistor having a first terminal and a control terminal, the first terminal being connected to the first node, the control terminal being configured to accept input of the second input signal, a fourth transistor having a first terminal and a control terminal, the first terminal being connected to the second node, the control terminal being configured to accept input of the second inverted signal, and a second switch connected between a fourth node to which second terminals of the second transistor and the fourth transistor are connected in common and the second power supply, and wherein a ratio between the number of first slice circuits, among the plurality of first slice circuits, in which the first switches are turned on and the number of second slice circuits, among the plurality of second slice circuits, in which the second switches are turned on is modified in accordance with the coefficient.

7. The electronic circuit according to claim 1, wherein the decision circuit includes a bistable circuit, the bistable circuit including a first inverter having a first power supply terminal and a second power supply terminal, the first power supply terminal being connected to a first power supply, the second power supply terminal being connected to a first node, and a second inverter having a first power supply terminal and a second power supply terminal, the first power supply terminal being connected to the first power supply, the second power supply terminal being connected to a second node.

8. The electronic circuit according to claim 1, wherein the decision circuit includes a third load connected at one end thereof to a first power supply and at the other end thereof to a first node, and a fourth load connected at one end thereof to the first power supply and at the other end thereof to a third node, and wherein the decision circuit decides on an output signal by comparing potentials at the first node and a second node.

9. The electronic circuit according to claim 8, wherein the decision circuit includes a bistable circuit that includes a first inverter and a second inverter, wherein the first node is connected to a control terminal of a transistor that is connected in parallel to one transistor of the first inverter, and wherein the second node is connected to a control terminal of a transistor that is connected in parallel to one transistor of the second inverter.

* * * * *